United States Patent
Baskaran et al.

(10) Patent No.: US 7,723,759 B2
(45) Date of Patent: May 25, 2010

(54) STACKED WAFER OR DIE PACKAGING WITH ENHANCED THERMAL AND DEVICE PERFORMANCE

(75) Inventors: Rajashree Baskaran, Chandler, AZ (US); Shriram Ramanathan, Portland, OR (US); Patrick R. Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 11/257,595

(22) Filed: Oct. 24, 2005

(65) Prior Publication Data

US 2007/0093066 A1  Apr. 26, 2007

(51) Int. Cl.
*H01L 23/34* (2006.01)
(52) U.S. Cl. .......... 257/276; 257/712; 257/720
(58) Field of Classification Search ......... 257/276, 257/720
See application file for complete search history.

(56) References Cited

U.S. PATENT DOCUMENTS

| | | | |
|---|---|---|---|
| 4,842,699 A | 6/1989 | Hua et al. | |
| 5,438,212 A * | 8/1995 | Okaniwa | 257/275 |
| 5,991,155 A * | 11/1999 | Kobayashi et al. | 361/705 |
| 6,091,603 A * | 7/2000 | Daves et al. | 361/704 |
| 6,278,181 B1 | 8/2001 | Maley | |
| 6,653,730 B2 * | 11/2003 | Chrysler et al. | 257/704 |
| 6,657,296 B2 * | 12/2003 | Ho et al. | 257/720 |
| 6,800,886 B2 * | 10/2004 | Awano | 257/276 |
| 6,933,602 B1 * | 8/2005 | Patel et al. | 257/712 |
| 7,241,645 B2 * | 7/2007 | Zhao et al. | 438/122 |
| 2002/0038908 A1 * | 4/2002 | Ding et al. | 257/720 |
| 2002/0113288 A1 | 8/2002 | Clevenger | |
| 2003/0038344 A1 | 2/2003 | Palmer et al. | |
| 2004/0080040 A1 | 4/2004 | Dotta et al. | |
| 2005/0014311 A1 * | 1/2005 | Hayasaka et al. | 438/109 |
| 2005/0087864 A1 * | 4/2005 | Yang et al. | 257/720 |
| 2006/0043583 A1 * | 3/2006 | Tamagawa et al. | 257/720 |
| 2006/0103008 A1 * | 5/2006 | Ong et al. | 257/706 |

FOREIGN PATENT DOCUMENTS

WO  2004059720 A1  7/2004

OTHER PUBLICATIONS

U.S. Appl. No. 10/949,463, filed Sep. 24, 2004; Inventor:Gilroy J. Vandentop.
U.S. Appl. No. 11/230,031, filed Sep. 19, 2005; Inventor:Rajashree Baskaran.
International Search Report and Written Opinion of the International Searching Authority; Dated Apr. 12, 2007; PCT/US2006/041779, 13 pgs.

* cited by examiner

*Primary Examiner*—Matthew C Landau
*Assistant Examiner*—James M Mitchell
(74) *Attorney, Agent, or Firm*—Kenneth A. Nelson

(57) ABSTRACT

An apparatus includes a metallization region including a plurality of metal layers on a device layer of a substrate, a via extending through the substrate and the device layer, and a heat spreading and stress engineering region in the substrate and adjacent to the device layer. The via contacts a metal layer in the metallization region.

11 Claims, 9 Drawing Sheets

STACKED WAFER OR DIE PACKAGING WITH ENHANCED THERMAL AND DEVICE PERFORMANCE

TECHNICAL FIELD

Embodiments of the invention relate to microelectronics technology. In particular, embodiments of the invention relate to stacked wafer or die packaging with enhanced thermal and device performance.

BACKGROUND

In semiconductor manufacturing, transistors may be formed on a semiconductor wafer. The transistors and other devices may be integrated to form integrated circuits (ICs) that perform numerous useful functions. Typically, a wafer may be diced and the individual IC die may be packaged and sold. In order to increase the performance of the ICs, it may be advantageous to improve the performance of the transistors. Further, as transistors become smaller, faster, and more advanced, it has become increasingly difficult to remove heat from operating transistors. Also, in packaging the wafer or die, denser packaging options, such as stacked die packaging may be advantageous. However, typical stacked die arrangements may not be suitable for typical heat removal devices, such as heat sinks.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to stacked wafer or die packaging are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

To decrease the size of microelectronics products, the packaging density of semiconductor chips may be increased. One method for increasing packaging density may be to stack chips. In operation, the active areas of the stacked chips may generate substantial amounts of heat, which may need to be removed so the chips may function properly. Typically, in single chip packaging, a back side cooling device, such as an integrated heat spreader or a fan, may be used to remove the heat. However, in stacked chip arrangements it may not be practicable to use backside cooling devices for each chip in the stack because of space constraints or incompatibility with electrical connection routing. Briefly, embodiments of the present invention may include heat spreading regions within a chip substrate that remove heat from the active area of the chip to enable a variety of stacked chip configurations.

Also, the active area of a chip may include an integrated circuit (IC) having transistors. The IC may include both N Channel Metal Oxide Semiconductor (NMOS) transistors and P Channel Metal Oxide Semiconductor (PMOS) transistors. To improve the performance of either transistor type, stress may be applied to the channel region of the transistors. In particular, a biaxial tensile stress may enhance the performance of both NMOS and the PMOS transistors. Embodiments of the present invention may include providing stress to IC transistors while enabling a variety of stacked chip configurations.

Figure 1:
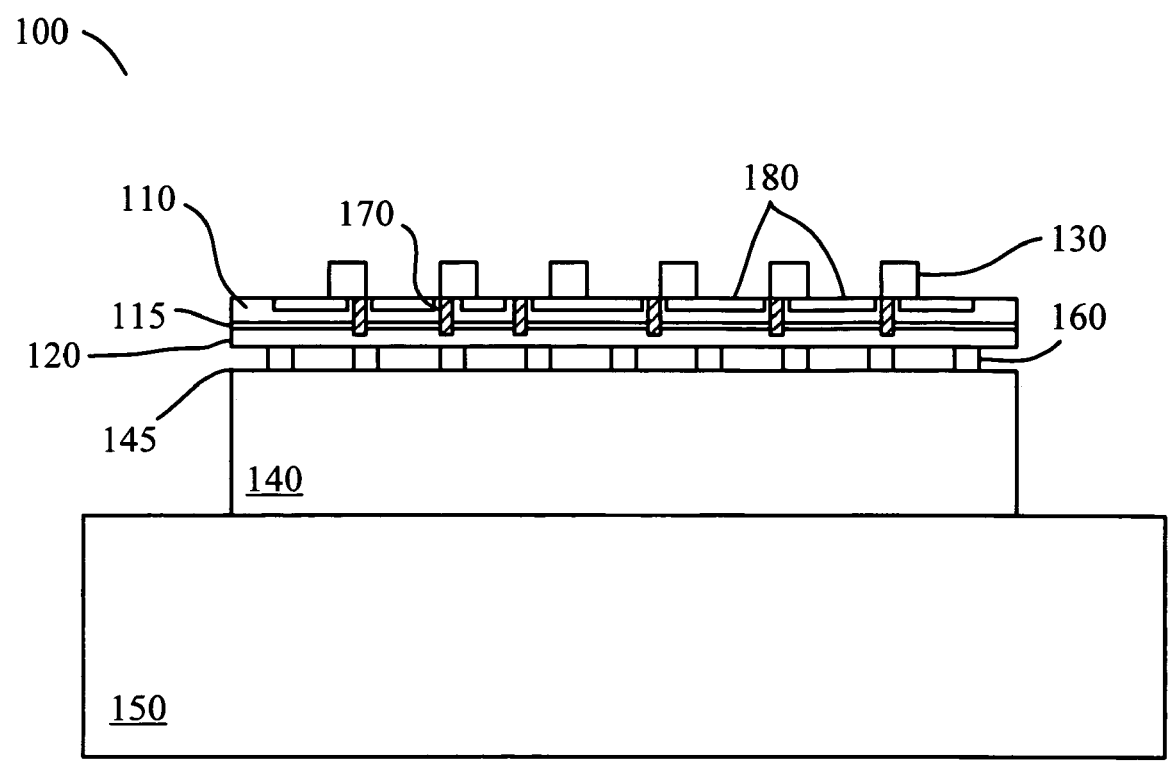
FIG. 1 illustrates a cross sectional view of a substrate including heat spreading and stress engineering regions and through vias connected to a substrate having a back side cooling device.

FIG. 1 illustrates an apparatus that may provide heat spreading and stress inducement for a stacked wafer or die.

FIG. 1 illustrates a cross-sectional type view of an apparatus 100. Apparatus 100 includes a substrate 140 having an active surface 145. Substrate 140 is attached to a cooling device 150 and connected to a substrate 110 by interconnects 160. Substrate 110 includes a device layer 115, a metallization region 120, vias 170, and regions 180, and has connections 130 on its back side.

Substrate 140 may include any suitable materials and active surface 145 may include any suitable devices. In an embodiment, substrate 140 may be a die. In another embodiment, substrate 140 may be a wafer. In an embodiment, substrate 140 may include a semiconductor. In other embodiments, substrate 140 may include silicon, silicon on insulator, germanium, or other materials. In an embodiment, substrate 140 may be a thin substrate having a thickness in the range of about 2 to 10 µm. In an embodiment, active surface 145 may include NMOS or PMOS transistors, other devices, metallization layers, dielectric layers, passivation layers, and bond pads. In an embodiment, substrate 140 may include a microprocessor. In another embodiment, substrate 140 may include a memory device.

Interconnects 160 may be any suitable material and may electrically connect substrate 140 and substrate 110. In some embodiments, interconnects may include a conductor, such as copper. In an embodiment, interconnects 160 may include a solder. In an embodiment, interconnects 160 may provide electrical routing for the devices of active surface 145. In an embodiment, interconnects 160 may include 3-D interconnects.

Cooling device 150 may be any suitable material or structure that removes heat from substrate 140. In an embodiment, cooling device 150 may include a heat sink. In another embodiment, cooling device 150 may include a thermal interface material. In another embodiment, cooling device 150 may include a fan. In an embodiment, cooling device 150 may include an integrated heat spreader. In an embodiment, cooling device 150 may be a back side cooling device, as the active surface 145 is termed the front side of substrate 140. In an embodiment, cooling device 150 may not be provided.

Substrate 110 may include any suitable materials. In an embodiment, substrate 110 may include a semiconductor. In other embodiments, substrate 110 may include silicon, silicon on insulator, germanium, or other materials. In an embodiment, substrate 110 may include silicon having a <100> silicon crystal. In another embodiment, substrate 110 may include silicon having a <110> silicon crystal. In an embodiment, substrate 110 may be a die. In another embodiment, substrate 110 may be a wafer. In an embodiment, substrate 110 may be a thin substrate having a thickness in the range of about 2 to 10 µm. In another embodiment, substrate 110 may be a thin substrate having a thickness in the range of about 2 to 5 µm.

Device layer 115 may include any suitable devices. In an embodiment, device layer 115 may include NMOS transistors. In another embodiment, device layer 115 may include PMOS transistors. In an embodiment, device layer 115 may include planar transistors. In another embodiment, device layer 115 may include non-planar or tri-gate transistors. In an embodiment, device layer 115 may include resistors and capacitors. In an embodiment, device layer 115 may be on the front side of substrate 110 and the side opposite the front side may be the back side of substrate 110. Device layer 115 may include any combination of the devices listed above.

Metallization region 120 may interconnect the devices of device layer 115 and may provide connection routing to external components. Metallization region 120 may include any number of interconnected metal and via layers separated by dielectric materials. In an embodiment, the metal layers of metallization region 120 may each be substantially planar and separated from each other by an interlayer dielectric (ILD). In an embodiment, the metal layers may be connected to adjacent metal layers by the vias of the via layers. In an embodiment, metallization region 120 may include a number of metal layers in the range of about 1 to 9. In an embodiment, metallization region 120 may provide connection to interconnects 160. In another embodiment, metallization region 120 may provide connection to interconnects 160 through bond pads (not shown). The metal and via layers of metallization region 120 may include any suitable conductive materials. In an embodiment, the metal and via layers of metallization region 120 may include copper.

Vias 170 may provide connection routing to external components for devices in device layer 115. In an embodiment, vias 170 may extend through substrate 110, device layer 115, and a part of metallization region 120. In an embodiment, vias 170 may be connected to a metal layer of metallization region 120. In an embodiment, vias 170 may extend through a portion of device layer 115 and metallization region 120 such that it does not contact or affect any devices or metal layers. In an embodiment, vias 170 may be through substrate vias.

Vias 170 may also be connected to connections 130. In an embodiment, vias 170 may be connected to connections 130 through bond pads (not shown). In another embodiment, vias 170 may be connected to connections 130 through metal traces (not shown) on the back side of substrate 110. Vias 170 may include any suitable conductive materials. In an embodiment, vias 170 may include copper.

Connections 130 may provide a connection to external components (not shown). In an embodiment, connections 130 may provide a connection and electrical routing for substrate 110. In another embodiment, connections 130 may provide electrical routing for substrate 140. In an embodiment, connections 130 may provide electrical routing for substrate 110 and substrate 140 and connection to an external substrate, such as a printed circuit board (PCB). In an embodiment, connections 130 may include copper. In another embodiment, connections 130 may include a solder. In an embodiment, connections 130 may be controlled collapse chip connect (C4) bumps.

Regions 180 may be provided in substrate 110 and may be adjacent to device layer 115. In an embodiment, regions 180 may provide a heat spreading region for device layer 115. In an embodiment, regions 180 may provide a stress inducement or stress engineering region for device layer 115. In another embodiment, regions 180 may provide a heat spreading and stress inducement region for device layer 115. In an embodiment, regions 180 may include copper. In an embodiment, regions 180 may include copper and may have a thickness in the range of about 10 to 30 µm. In another embodiment, regions 180 may include copper and may have a thickness in the range of about 10 to 120 µm. In an embodiment, regions 180 may include copper and may have a thickness in the range of about 80 to 120 µm. In another embodiment, regions 180 may include copper with diamond particles.

In another embodiment, regions 180 may include diamond or a diamond like carbon material. A diamond like carbon material may be formed by depositing carbon at a temperature in the range of about 360 to 440° C. In an embodiment, regions 180 may include diamond or a diamond like material having a thickness in the range of about 1 to 100 µm. In another embodiment, regions 180 may include diamond or a diamond like material having a thickness in the range of about 1 to 10 µm. In an embodiment, regions 180 may include diamond or a diamond like material having a thickness in the range of about 5 to 25 µm.

As discussed, regions 180 may provide a heat spreading region for device layer 115. In general, a material's ability to transfer heat may be governed by the material's thermal conductivity, which is given in units of Watts per meter-Kelvin (W/m·K). In an embodiment, the thermal conductivity of regions 180 may be greater than the thermal conductivity of substrate 110, causing heat to be removed from device layer 115 more quickly with regions 180 than without. In various embodiments, substrate 110 may include silicon (<100 W/m·K) and regions 180 may include diamond (>1000 W/m·K), diamond like materials (~400-500 W/m·K), or copper (400 W/m·K). In an embodiment, regions 180 may enable substrate 110 to operate properly by removing heat from device layer 115. In an embodiment, regions 180 may have a thermal conductivity that is about 4 to 20 times greater than the thermal conductivity of substrate 110. In another embodiment, regions 180 may have a thermal conductivity that is about 2 to 10 times greater than the thermal conductivity of substrate 110. In an embodiment, regions 180 may have a thermal conductivity that is about 4 to 10 times greater than the thermal conductivity of substrate 110.

As discussed, regions 180 may provide stress inducement on device layer 115. A biaxial tensile stress induced on device layer 115 may increase the performance of both NMOS and PMOS transistors in device layer 115. In an embodiment, regions 180 may be stress engineering structures.

The stress induced on device layer 115 may be caused by a coefficient of thermal expansion (CTE) mismatch between the materials of substrate 110 and regions 180.

In an embodiment, substrate 110 may include silicon, device layer 115 may operate at a temperature in the range of about 90 to 110° C., and regions 180 may include copper plated at a temperature of about 20 to 30° C. In such an embodiment, a tensile stress may be caused on device layer 115 at the operating temperature because copper has a higher CTE than silicon and the stress free temperature of the copper is the plating temperature. In an embodiment, regions 180 may have a higher CTE than substrate 110 and regions 180 may be disposed at a temperature below the operating temperature of device layer 115, causing a tensile stress on device layer 115.

In another embodiment, substrate 110 may include silicon, device layer 115 may operate at a temperature of about 90 to 110° C., and regions 180 may include diamond or a diamond like material deposited at a temperature in the range of about 360 to 440° C. In such an embodiment, a tensile stress may be caused on device layer 115 at the operating temperature because diamond or a diamond like material has a lower CTE than silicon and the stress free temperature of the diamond or diamond like material is the deposition temperature. In an embodiment, regions 180 may have a lower CTE than substrate 110 and regions 180 may be disposed at a temperature above the operating temperature of device layer 115, causing a tensile stress on device layer 115.

The tensile stress on the device layer may be any amount of tensile stress. In an embodiment, the tensile stress may be in the range of about 0.1 to 5 GPa. In another embodiment, the tensile stress may be in the range of about 1 to 2 GPa. In another embodiment, the tensile stress may be in the range of about 0.5 to 3 GPa.

FIG. 1 illustrates two substrates 110, 140 connected by their active or front surfaces by interconnects 160. Substrate 140 includes cooling device 150 attached to its back side and substrate 110 includes heat spreading and stress inducement regions 180 and through substrate vias 170, and has eternal connections 130 on its backside. However, numerous other configurations may be available. As illustrated in FIG. 1, substrate 110 may include connections 130. Connections 130 may facilitate connection to the back side of another substrate similar to substrate 110 that includes heat spreading and stress inducement regions and through substrate vias. In an analogous manner, several substrates similar to substrate 110 may be stacked.

FIGS. 2A-2F illustrate a method that may provide heat spreading and stress inducement regions for a stacked wafer or die.

Figure 2A:
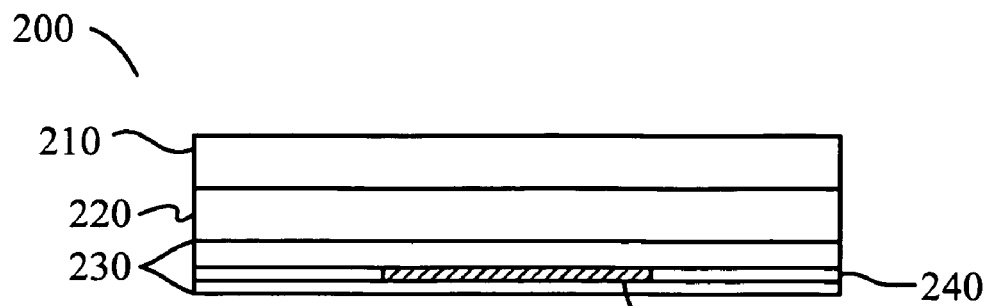
FIGS. 2A-2F illustrate cross sectional views of a method for forming heat spreading and stress engineering regions and through vias in a substrate.

FIG. 2A illustrates an apparatus 200 including a substrate 210 having a device layer 220 and a metallization region 230. In an embodiment, apparatus 200 may be attached to a carrier (not shown), such as thick silicon, by a bonding layer (not shown), as is discussed with respect to FIGS. 3A-3H below. Metallization region 230 may include any number of metal layers and via layers separated by dielectric materials. FIG. 2A illustrates only one metal layer including metallization 250 and dielectric 240 for the sake of clarity. In an embodiment, metallization region 230 may include a number of metal layers in the range of about 1 to 9.

Substrate 210 may include any suitable material. In an embodiment, substrate 210 may include a semiconductor. In other embodiments, substrate 210 may include silicon, silicon on insulator, germanium, or other materials. In an embodiment, substrate 210 may be a die. In another embodiment, substrate 210 may be a wafer. In an embodiment, substrate 210 may be a thin substrate having a thickness in the range of about 2 to 10 μm. In another embodiment, substrate 210 may be a thin substrate having a thickness in the range of about 2 to 5 μm.

Device layer 220 may include any suitable devices. In an embodiment, device layer 220 may include NMOS transistors. In another embodiment, device layer 220 may include PMOS transistors. In an embodiment, device layer 220 may include planar transistors. In another embodiment, device layer 220 may include non-planar or tri-gate transistors. In an embodiment, device layer 220 may include resistors and capacitors. Device layer 220 may include any combination of the devices listed above. In general, the front side of substrate 210 may be considered the side having device layer 220 and metallization region 240 and the back side of substrate 210 may be opposite the front side.

Metallization region 230 may interconnect the devices of device layer 220 and may provide connection routing to external components. The metal and via layers of metallization region 230 may include any suitable conductive materials. In an embodiment, the metal and via layers of metallization region 230 may include copper.

Figure 2B:
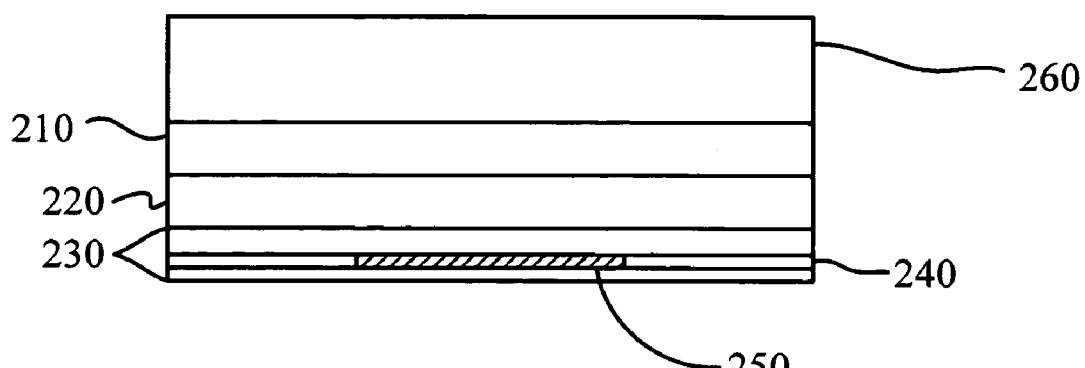

As illustrated in FIG. 2B, a layer 260 may be formed on the backside of substrate 210. Layer 260 may be formed by any suitable technique and may be any suitable material. In an embodiment, layer 260 may include copper and may be formed by plating. In another embodiment, layer 260 may include copper and may be formed by plating at a temperature in the range about 20 to 30° C. In an embodiment, layer 260 may include copper and may have a thickness in the range of about 10 to 30 μm. In another embodiment, layer 260 may include copper and may have a thickness in the range of about 10 to 120 μm. In an embodiment, layer 260 may include copper and may have a thickness in the range of about 80 to 120 μm. In an embodiment, layer 260 may include copper with diamond particles.

In an embodiment, layer 260 may include diamond or a diamond like material. In another embodiment, layer 260 may include diamond or a diamond like material deposited at a temperature in the range of about 360 to 440° C. In an embodiment, layer 260 may include diamond or a diamond like material, substrate 210 may include silicon, and layer 260 may be thin relative to substrate 210 because diamond or a diamond like material is substantially (about 10 times) stiffer than silicon. In an embodiment, layer 260 may include diamond or a diamond like material and may have a thickness in the range of about 1 to 100 μm. In an embodiment, layer 260 may include diamond or a diamond like material and may have a thickness in the range of about 1 to 10 μm. In an embodiment, layer 260 may include diamond or a diamond like material and may have a thickness in the range of about 5 to 25 μm.

As discussed above, the CTE mismatch between layer 260 and substrate 210 may cause a tensile stress to be induced on the devices of device layer 220 during operation. In an embodiment, the CTE of layer 260 may be greater than the CTE of substrate 210 and layer 260 may be formed at a temperature below the operating temperature of device layer 220. In another embodiment, the CTE of layer 260 may be less than the CTE of substrate 210 and layer 260 may be formed at a temperature above the operating temperature of device layer 220.

Figure 2C:
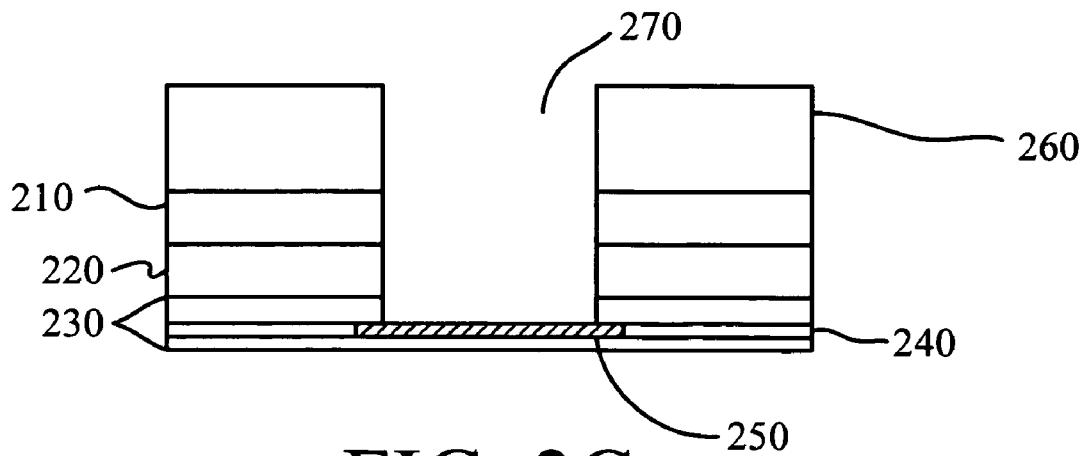

As illustrated in FIG. 2C, an opening 270 may be formed in layer 260, substrate 210, device layer 220, a portion of metallization region 230 to expose metallization 250. Opening 270 may be formed by any suitable technique. In an embodiment, opening 270 may be formed first forming a pattern (not shown) on layer 260, then etching layer 260, substrate 210, device layer 220, and a portion of metallization region 230, and finally removing the pattern. In an embodiment, metallization 250 may act as an etch stop during an etch of layer 260, substrate 210, device layer 220, and a portion of metallization region 230. In an embodiment, the pattern may include photoresist. In another embodiment, opening 270 may be formed by drilling through layer 260, substrate 210, device layer 220, and a portion of metallization region 230.

Figure 2D:
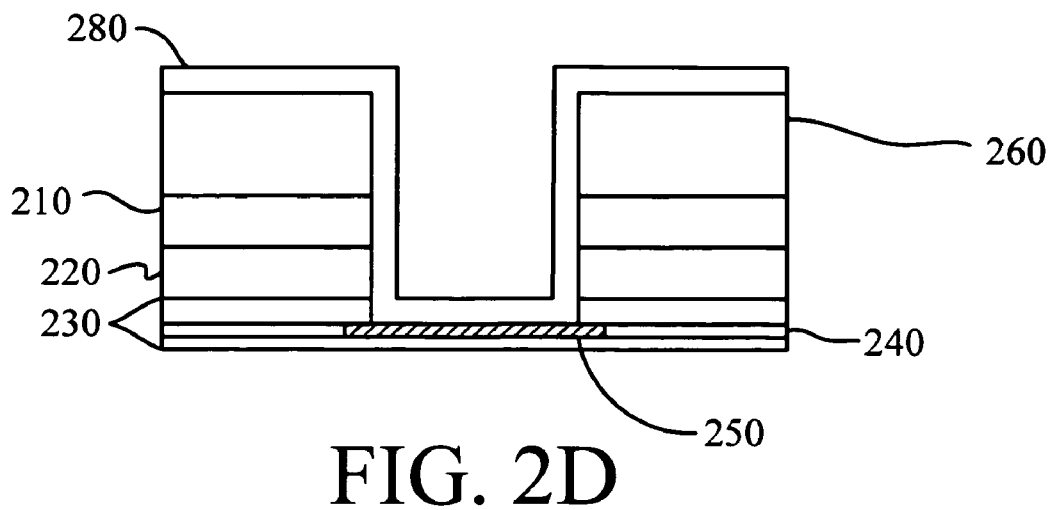

As illustrated in FIG. 2D, an insulator 280 may be formed over opening 270 and layer 260. Insulator 280 may be formed by any suitable technique and may include any suitable material. In an embodiment, insulator 280 may include a nitride or an oxide. In an embodiment, insulator 280 may be formed by a deposition.

Figure 2E:
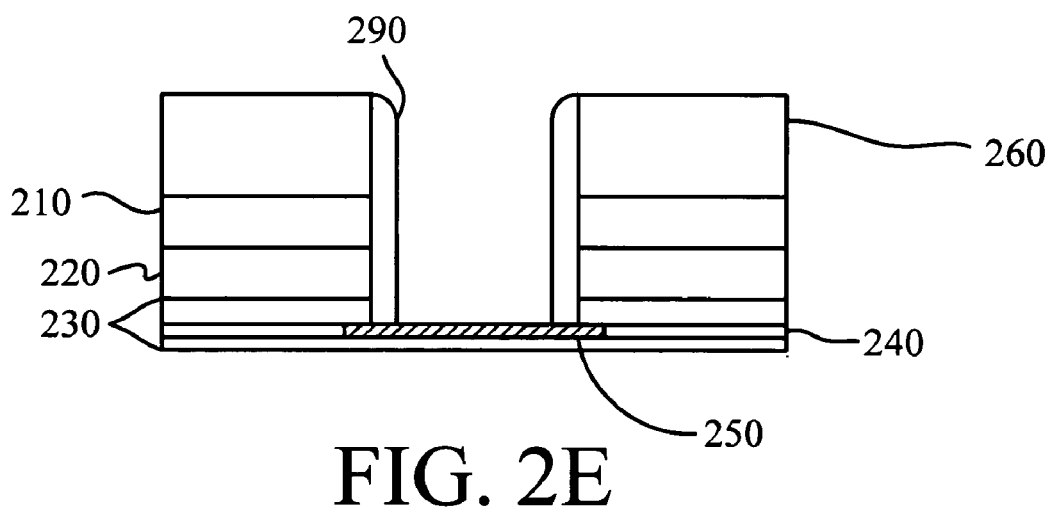

As illustrated in FIG. 2E, sidewalls 290 may be formed. Sidewalls 290 may be formed by any suitable technique. In an embodiment, sidewalls 290 may be formed by an anisotropic etch of insulator 280.

Figure 2F:
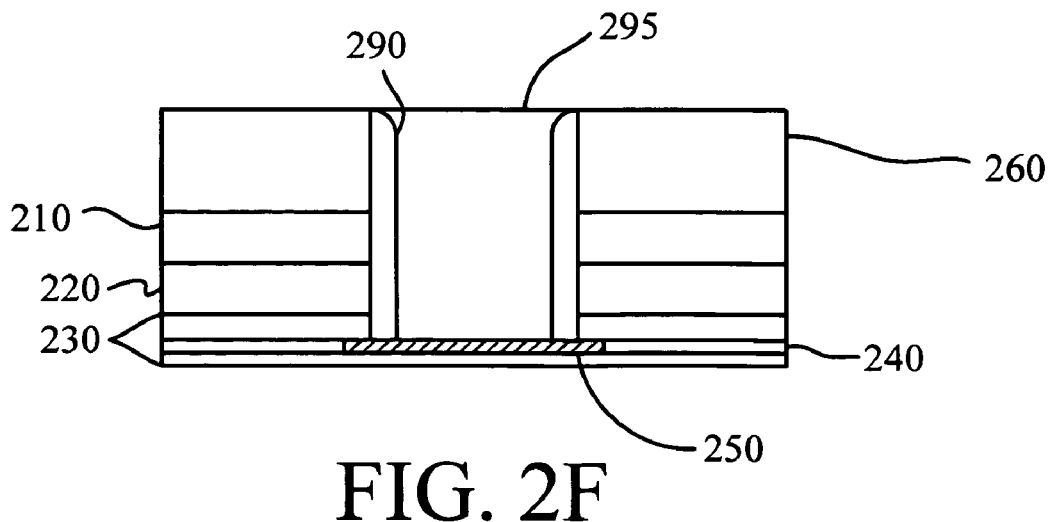

As illustrated in FIG. 2F, a via 295 may be formed in opening 270. Via 295 may be formed by any suitable technique and may include any suitable material. In an embodiment, via 295 may extend through layer 260, substrate 210, device layer 220, and a portion of metallization region 230. In an embodiment, via 295 may be a conductive fill. Via 295 may include any conductive material. In an embodiment, via 295 may include copper. In an embodiment, via 295 may be formed by plating. In an embodiment, sidewalls 290 may electrically isolate via 295 from layer 260, substrate 210, device layer 220, and a portion of metallization region 230.

In an embodiment, connections may be formed on the backside of substrate 210 (not shown). In an embodiment, the connections may be C4 bumps. In another embodiment, the connections may include copper.

FIGS. 3A-3H illustrate a method that may provide heat spreading and stress inducement regions for a stacked wafer or die.

Figure 3A:
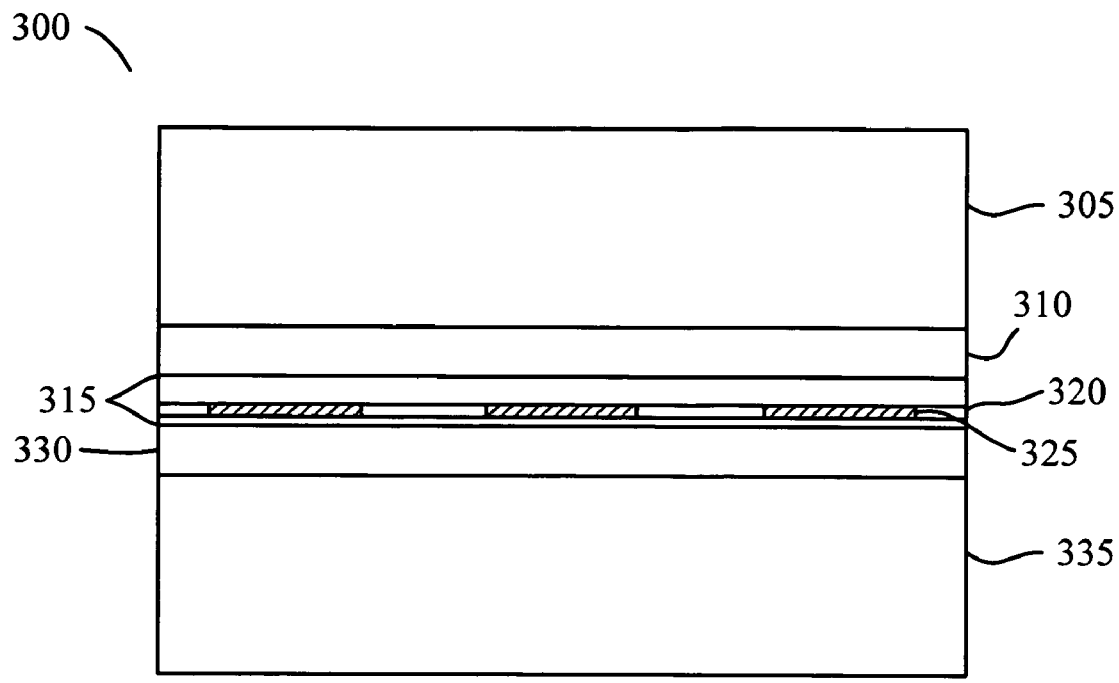
FIG. 3A-3H illustrate cross sectional views of a method for forming heat spreading and stress engineering regions and through vias in a substrate.

FIG. 3A illustrates an apparatus 300 including a substrate 305 having a device layer 310 and a metallization region 315. Metallization region 315 may include any number of metal layers and via layers separated by dielectric materials. FIG. 3A illustrates only one metal layer including metallization 325 and dielectric 320 for the sake of clarity. In an embodiment, metallization region 315 may include a number of metal layers in the range of about 1 to 9.

Apparatus 300 also includes a bonding layer 330 and a carrier 335. Bonding layer 330 and carrier 335 may be any suitable materials. In an embodiment, carrier 335 may be thick silicon. In an embodiment, carrier 335 may include an active layer and metallization layers (not shown). In an embodiment, bonding layer 330 and carrier 335 may not be used.

Substrate 305 may include any suitable materials. In an embodiment, substrate 305 may include a semiconductor. In other embodiments, substrate 305 may include silicon, silicon on insulator, germanium, or other materials. In an embodiment, substrate 305 may be a die. In another embodiment, substrate 305 may be a wafer. In an embodiment, substrate 305 may be a thin substrate having a thickness in the range of about 2 to 10 μm. In another embodiment, substrate 305 may be a thin substrate having a thickness in the range of about 2 to 5 μm.

Device layer 310 may include any suitable devices. In an embodiment, device layer 310 may include NMOS transistors. In another embodiment, device layer 310 may include PMOS transistors. In an embodiment, device layer 310 may include planar transistors. In another embodiment, device layer 310 may include non-planar or tri-gate transistors. In an embodiment, device layer 310 may include resistors and capacitors. Device layer 310 may include any combination of the devices listed above. In general, the front side of substrate 305 may be considered the side having device layer 310 and metallization region 315 and the back side of substrate 305 may be opposite the front side.

Metallization region 315 may interconnect the devices of device layer 310 and may provide connection routing to external components. The metal and via layers of metallization region 315 may include any suitable conductive materials. In an embodiment, the metal and via layers of metallization region 315 may include copper.

Figure 3B:
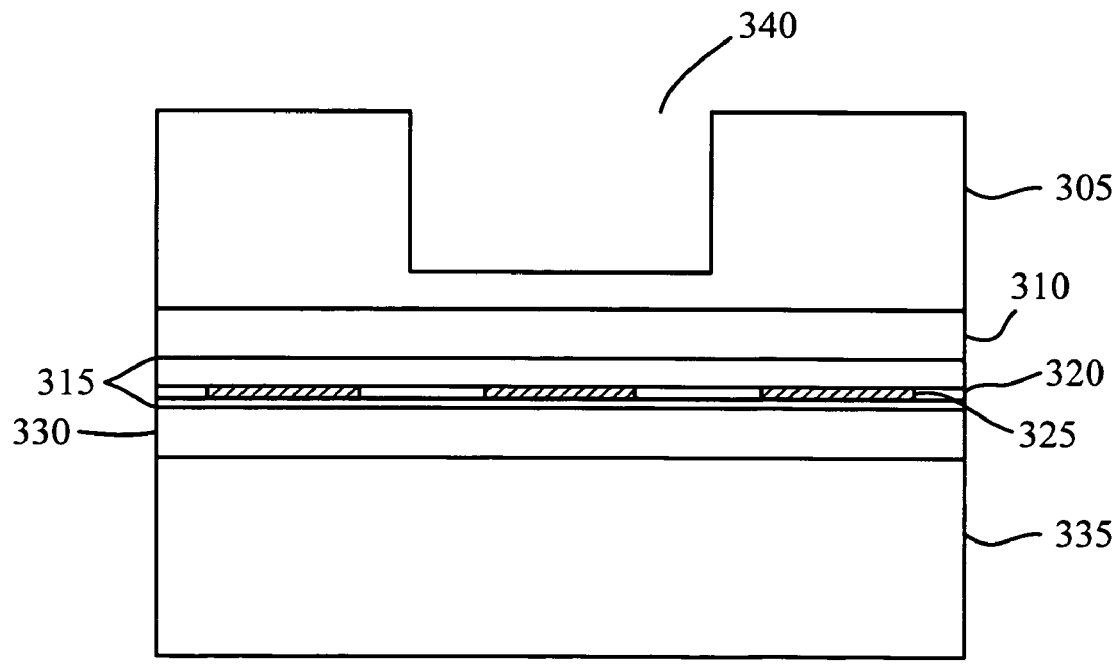

As illustrated in FIG. 3B, a trench 340 may be formed in substrate 305. Trench 340 may be formed by any suitable technique. In an embodiment, trench 340 may be formed by first forming a pattern (not shown) on substrate 305, then etching substrate 305, and finally removing the pattern. In an embodiment, the pattern may include a photoresist.

Figure 3C:
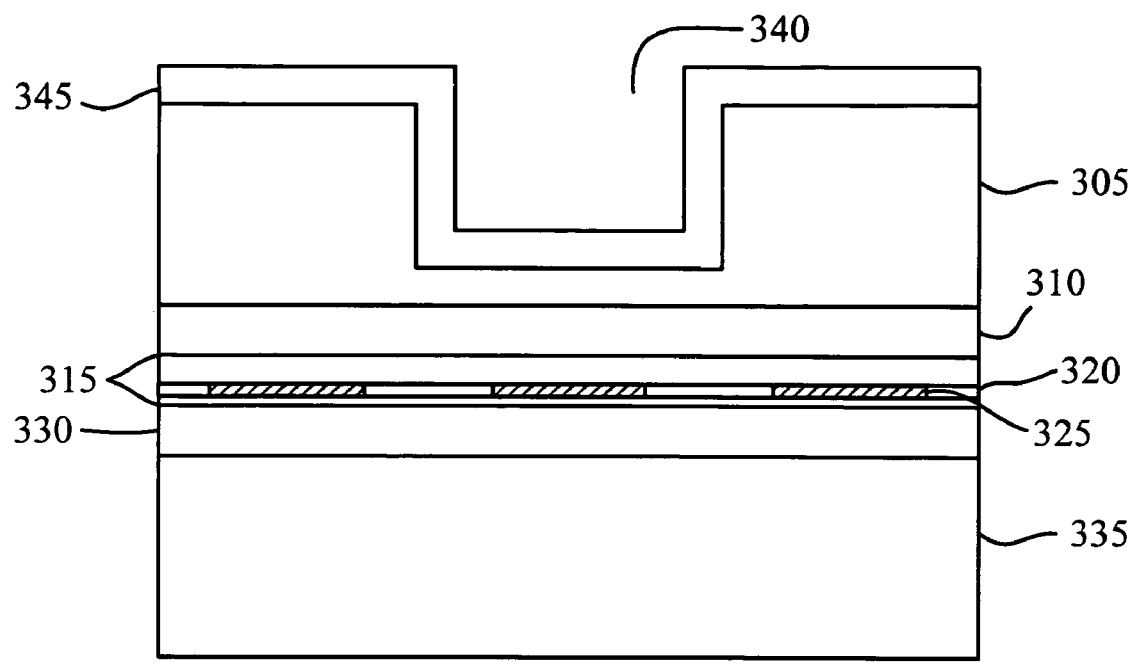

As illustrated in FIG. 3C, an insulator 345 may be formed over trench 340 and substrate 305. Insulator 345 may be formed by any suitable technique and may be any suitable material. In an embodiment, insulator 345 may include a nitride or an oxide.

Figure 3D:
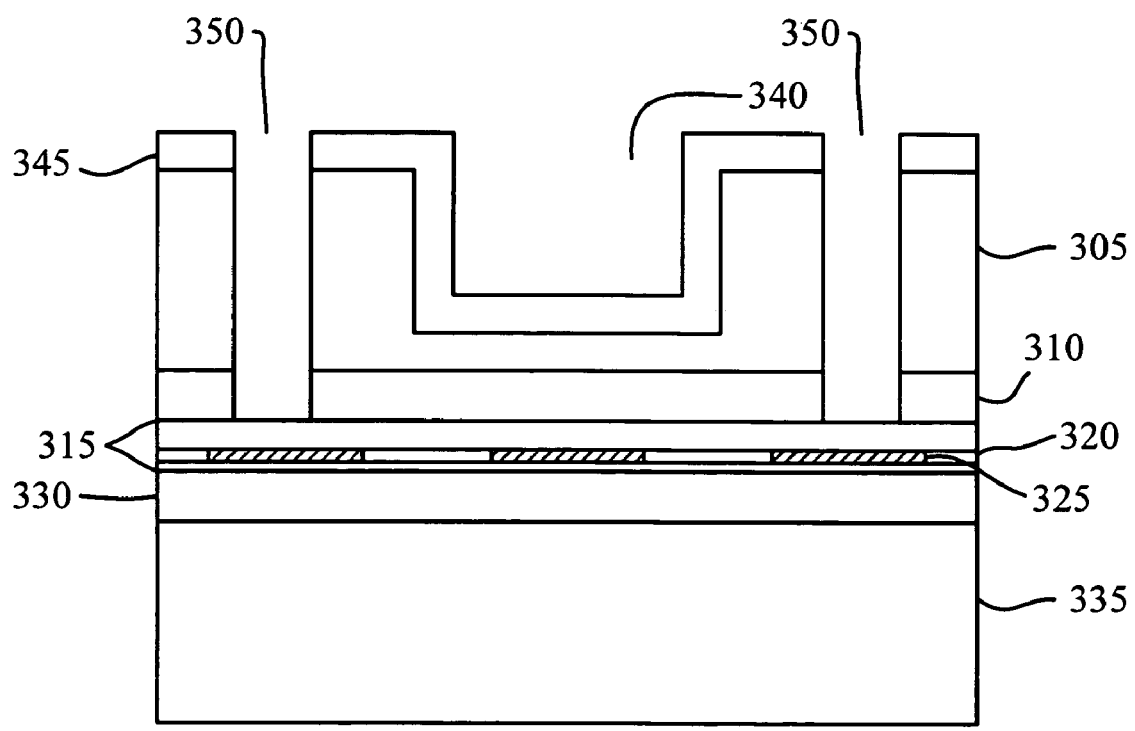

As illustrated in FIG. 3D, openings 350 may be formed in insulator 345, substrate 305, and device layer 310 to expose metallization region 315. Openings 350 may be formed by any suitable technique. In an embodiment, openings 350 may be formed by first forming a pattern (not shown) on insulator 345, then etching insulator 345, substrate 305, and device layer 310, and finally removing the pattern. In an embodiment, the pattern may include photoresist. In an embodiment, dielectric material in metallization region 315 may act as an etch stop.

Figure 3E:
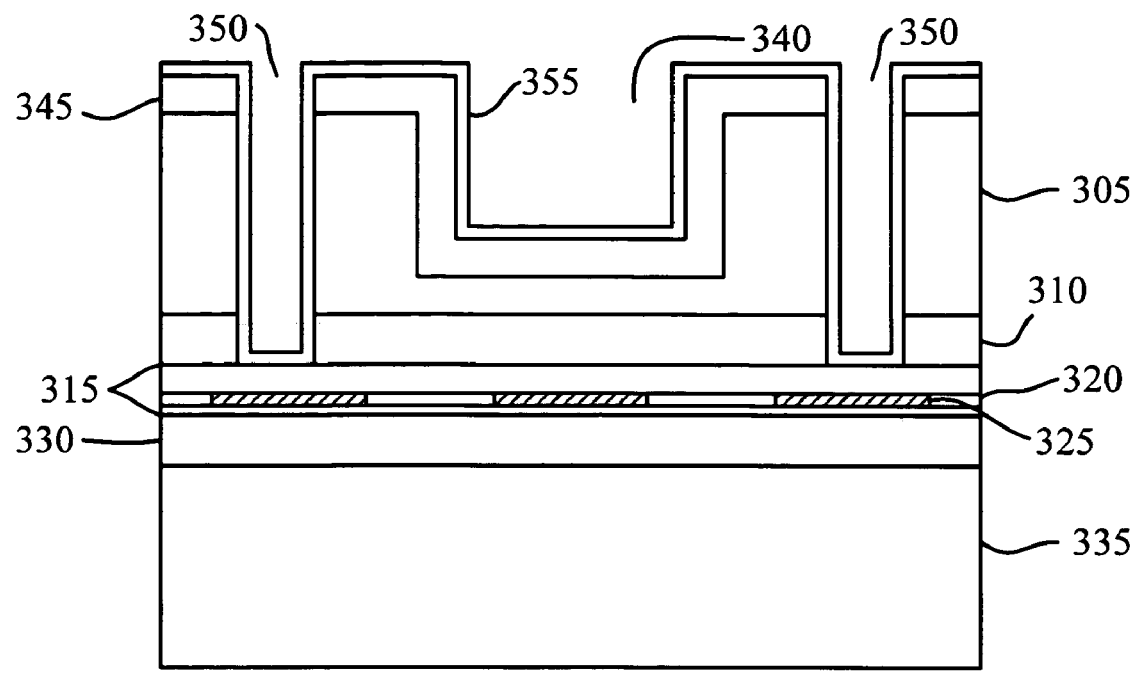

As illustrated in FIG. 3E, an insulator 355 may be formed over openings 350 and insulator 345. Insulator 355 may be formed by any suitable technique and may be any suitable material. In an embodiment, insulator 355 may include a nitride or an oxide. In an embodiment, insulator 355 may electrically insulate vias (discussed further below) from substrate 305 and device layer 310.

Figure 3F:
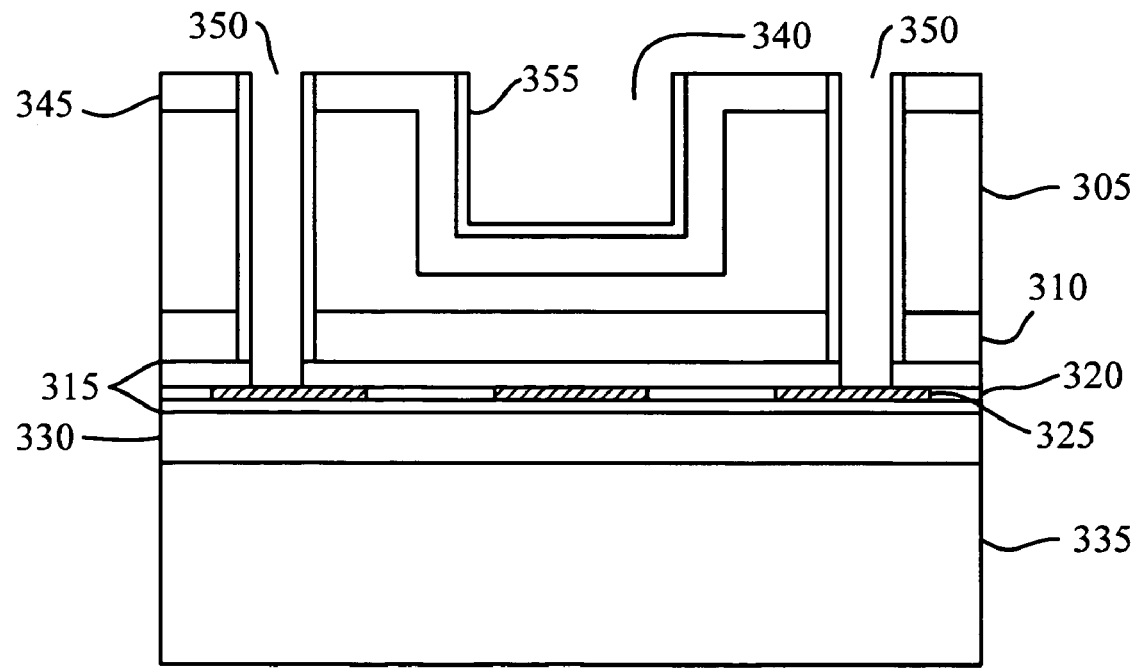

As illustrated in FIG. 3F, a break-through etch may be performed to expose metallization 325. The break-through etch may be performed by any suitable technique. In an embodiment, the break-through etch may include an anisotropic etch.

Figure 3G:
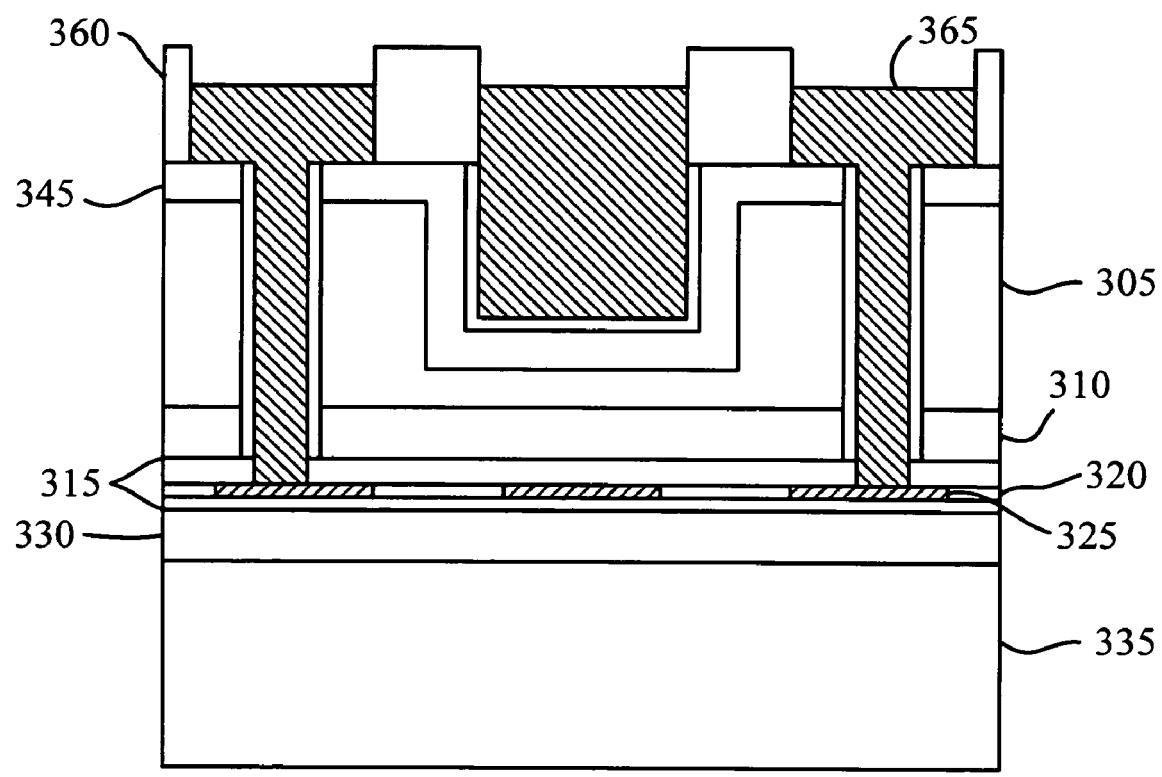

As illustrated in FIG. 3G, a pattern 360 and a conductive fill 365 may be formed. Pattern 360 may be formed by any suitable technique and may include any suitable materials. In an embodiment, pattern 360 may include photoresist and may be formed by a photolithography process.

Conductive fill 365 may be formed by any suitable technique and may be any suitable material. In an embodiment, conductive fill 365 may include copper. In an embodiment, conductive fill 365 may be formed by plating. In an embodiment, conductive fill 365 may be formed by plating at a temperature in the range of about 20 to 30° C. In an embodiment, the portion of conductive fill in openings 350 may form a conductive through via. In an embodiment, the portion of conductive fill 365 in trench 340 may form a stress engineering region and provide a tensile stress on device layer 310. In an embodiment, conductive fill 365 may have CTE greater than the CTE of substrate 305 and conductive fill 365 may be formed at a temperature below the operation temperature of device layer 310. In an embodiment, conductive fill 365 may have CTE less than the CTE of substrate 305 and conductive fill 365 may be formed at a temperature above the operation temperature of device layer 310. In an embodiment, the portion of conductive fill 365 in trench 340 may provide a heat spreading region for device layer 310.

Figure 3H:
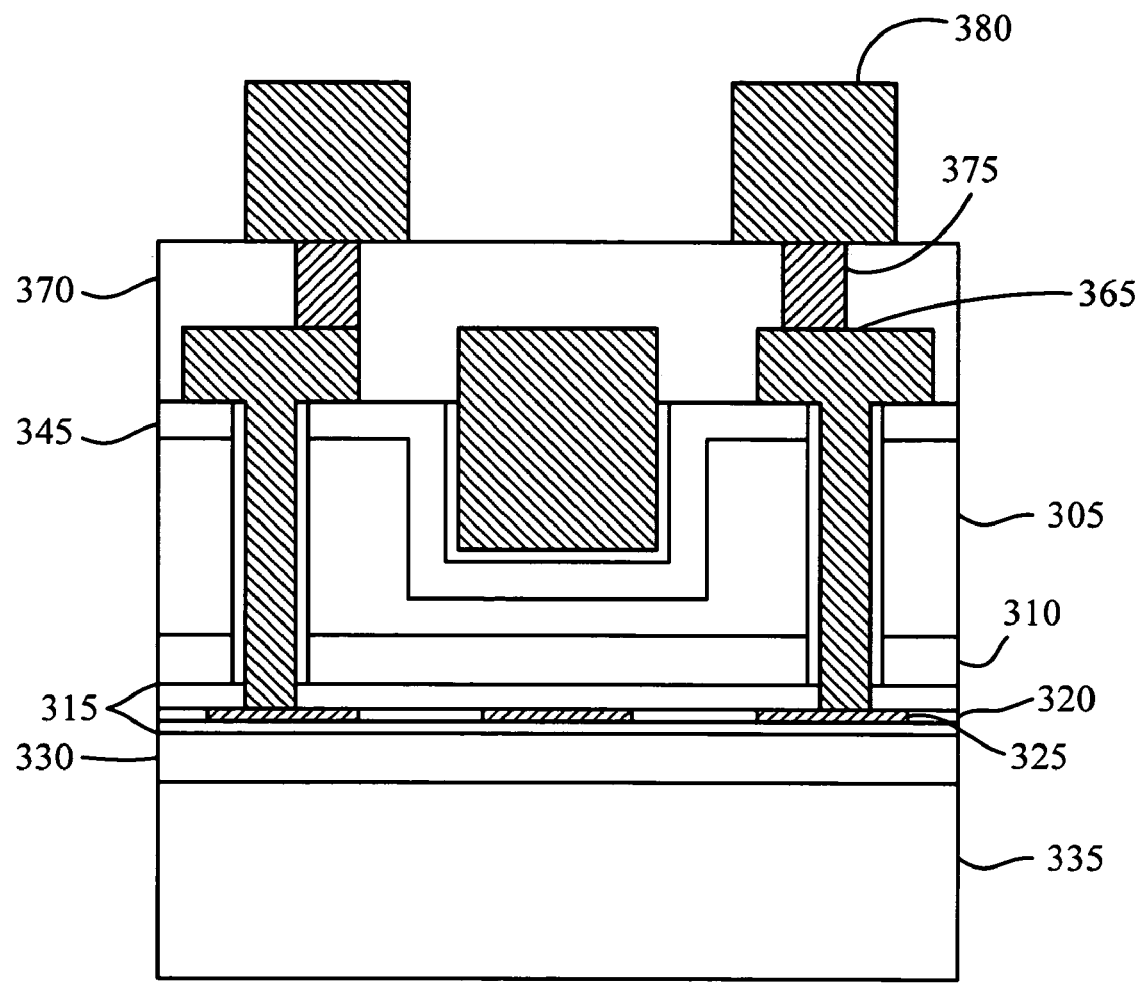

As illustrated in FIG. 3H, pattern 360 may be removed and a dielectric 370, conductors 375, and connections 380 may be formed over conductive fill 345. Dielectric 370, conductors 375, and connections 380 may be formed by any suitable technique and may include any suitable material. In an embodiment, dielectric 370 may be formed by a spin on method. In an embodiment, conductors 375 may be formed by a pattern, etch, pattern removal, and plating process. In an embodiment, conductors may include copper. In an embodiment, connections 380 may include bumps. In an embodiment, connections 380 may be formed by a C4 process. In an embodiment, connections 380 may allow flip-chip connection to a substrate, such as a printed circuit board.

Figure 4:
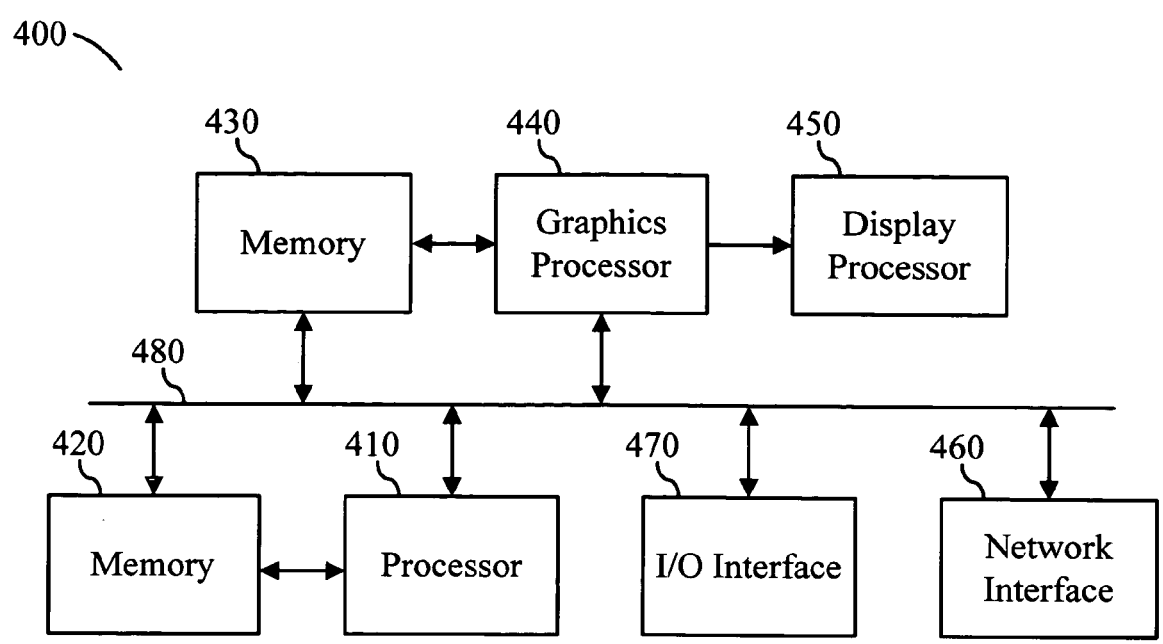
FIG. 4 illustrates a schematic of a system that includes heat spreading and stress engineering regions in a substrate

FIG. 4 illustrates a system 400. System 400 may include a processor 410, a memory 420, a memory 440, a graphics processor 440, a display processor 450, a network interface 460, an I/O interface 470, and a communication bus 480. In an embodiment, memory 420 may include a volatile memory component. Any of the components in system 400 may include a heat spreading and stress engineering region as discussed above. Further, as discussed above, the disclosed invention enables chip stacking including heat spreading and stress engineering regions. A large number of combinations of stacked components including heat spreading and stress engineering regions may be available. In an embodiment, memory 420 may include the heat spreading and stress engineering region, and memory 420 may be stacked with processor 410. In an embodiment, system 400 may include a second processor (not shown) and the second processor may include the heat spreading and stress engineering region, and the second processor may be stacked with 410.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
 a metallization region including a plurality of metal layers on a die including an active area;
 a via extending through the die and the active area; and contacting a metal layer in the metallization region;
 a discrete heat spreading and stress engineering region that induces stress on the device layer and that is located in the die and adjacent to the active area;
 an interconnect on the metallization region, wherein the interconnect is connected to an active surface of a substrate; and
 a cooling device attached to a surface of the substrate opposite the active surface.

2. The apparatus of claim 1, wherein the heat spreading and stress engineering region comprises copper.

3. The apparatus of claim 1, wherein the heat spreading and stress engineering region comprises at least one of diamond, a diamond like material, or copper with diamond particles.

4. The apparatus of claim 1, wherein the heat spreading and stress engineering region causes a biaxial tensile stress on a transistor in the device layer.

5. The apparatus of claim 4, wherein the biaxial tensile stress is in the range of about 0.5 to 3 GPa.

6. The apparatus of claim 1, wherein the heat spreading and stress engineering region has a thermal conductivity that is in the range of about 4 to 20 times greater than a thermal conductivity of the substrate.

7. The apparatus of claim 1, wherein the cooling device comprises an integrated heat spreader.

8. An apparatus comprising:
 a first active surface including a metallization region of a first substrate coupled to a second active surface of a second substrate by an interconnect, wherein the first substrate includes a heat spreading and stress engineering region adjacent to the first active surface and further includes a via extending through the first substrate and contacting a metal layer of the metallization region, wherein the heat spreading and stress engineering region induces stress on the first active surface; and
 a cooling device on a surface opposite the active surface of the second substrate.

9. The apparatus of claim 8, further comprising:
 a printed circuit board connected to a bump on a surface of the first substrate opposite the active surface of the first substrate.

10. The apparatus of claim 8, wherein the heat spreading and stress engineering region comprises at least one of copper, diamond, a diamond like carbon, or copper with diamond particles.

11. The apparatus of claim 8, wherein the heat spreading and stress engineering region causes a biaxial tensile stress in the range of about 0.5 to 3 GPa on a transistor in the first substrate and the heat spreading and stress engineering region has a thermal conductivity that is in the range of about 4 to 20 times greater than a thermal conductivity of the first substrate.

* * * * *